(12) United States Patent
Shiode

(10) Patent No.: US 11,413,651 B2
(45) Date of Patent: Aug. 16, 2022

(54) IMPRINT APPARATUS, OPERATION METHOD OF IMPRINT APPARATUS, AND ARTICLE MANUFACTURING METHOD

(71) Applicant: CANON KABUSHIKI KAISHA, Tokyo (JP)

(72) Inventor: Yoshihiro Shiode, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 313 days.

(21) Appl. No.: 15/459,023

(22) Filed: Mar. 15, 2017

(65) Prior Publication Data
US 2017/0274418 A1    Sep. 28, 2017

(30) Foreign Application Priority Data
Mar. 22, 2016    (JP) .............................. JP2016-057557

(51) Int. Cl.
| B05D 3/12 | (2006.01) |
| G03F 7/00 | (2006.01) |
| G03F 9/00 | (2006.01) |
| B05D 3/00 | (2006.01) |

(52) U.S. Cl.
CPC .............. B05D 3/12 (2013.01); B05D 3/007 (2013.01); G03F 7/0002 (2013.01); G03F 9/7042 (2013.01)

(58) Field of Classification Search
CPC ......... B05D 3/12; B05D 3/007; G03F 9/7042; G03F 7/0002
See application file for complete search history.

(56) References Cited

U.S. PATENT DOCUMENTS

| 5,773,953 | A | * | 6/1998 | Ukaji ................. G03F 7/70691 318/687 |
| 6,498,685 | B1 | * | 12/2002 | Johnson ................. G21K 1/06 347/241 |
| 7,423,726 | B2 | * | 9/2008 | Kosugi ............... G03F 7/70725 355/52 |

(Continued)

FOREIGN PATENT DOCUMENTS

| JP | 2005101201 A | 4/2005 |
| JP | 2006516065 A | 6/2006 |

(Continued)

OTHER PUBLICATIONS

Office Action issued in Japanese Appln. No. 2016-057557 dated Dec. 20, 2019.

*Primary Examiner* — Joseph S Del Sole
*Assistant Examiner* — Guy F Mongelli
(74) *Attorney, Agent, or Firm* — Rossi, Kimms & McDowell LLP

(57) ABSTRACT

An imprint apparatus performs an imprint process of forming a pattern on a substrate by bringing a mold into contact with an imprint material on the substrate and curing the imprint material. The apparatus includes a substrate stage mechanism having a substrate chuck configured to hold the substrate, a mold driver configured to drive the mold, and a controller configured to control, based on tilt information indicating a tilt of the substrate chuck which is caused by a force received from the mold driver, the mold driver so as to adjust a relative tilt of the mold with respect to the substrate in the imprint process.

10 Claims, 8 Drawing Sheets

(56) References Cited

U.S. PATENT DOCUMENTS

| | | | |
|---|---|---|---|
| 7,525,106 B2* | 4/2009 | Imoto | G03F 7/70808 |
| | | | 250/365 |
| 8,134,686 B2* | 3/2012 | Ogino | G03F 7/70341 |
| | | | 355/53 |
| 8,556,616 B2 | 10/2013 | Resnick et al. | |
| 2001/0013927 A1* | 8/2001 | Itoh | G03F 7/70716 |
| | | | 355/53 |
| 2004/0124566 A1* | 7/2004 | Sreenivasan | B81C 1/0046 |
| | | | 264/494 |
| 2004/0239905 A1* | 12/2004 | Van Rhee | G03F 7/70508 |
| | | | 355/55 |
| 2005/0259233 A1* | 11/2005 | Streefkerk | G03F 7/70783 |
| | | | 355/53 |
| 2007/0172967 A1* | 7/2007 | Katagiri | B82Y 10/00 |
| | | | 438/14 |
| 2009/0091723 A1* | 4/2009 | Sasaki | B82Y 10/00 |
| | | | 355/53 |
| 2009/0262320 A1* | 10/2009 | Staals | G03F 9/7003 |
| | | | 355/55 |
| 2009/0315223 A1* | 12/2009 | Yoneda | B82Y 10/00 |
| | | | 264/402 |
| 2010/0052217 A1* | 3/2010 | Kasumi | B29C 43/021 |
| | | | 264/293 |
| 2010/0314798 A1* | 12/2010 | Kawakami | B82Y 10/00 |
| | | | 264/293 |
| 2011/0133354 A1* | 6/2011 | Kimura | B82Y 10/00 |
| | | | 264/40.5 |
| 2012/0292801 A1* | 11/2012 | Maeda | G03F 9/7042 |
| | | | 264/40.5 |
| 2013/0015598 A1* | 1/2013 | Kimura | B82Y 10/00 |
| | | | 264/40.1 |
| 2013/0015599 A1* | 1/2013 | Kawahara | G03F 7/0002 |
| | | | 264/40.5 |
| 2013/0206995 A1* | 8/2013 | Sur | G01T 7/00 |
| | | | 250/370.1 |
| 2013/0300031 A1* | 11/2013 | Torii | B29C 59/026 |
| | | | 264/293 |
| 2014/0239529 A1* | 8/2014 | Tan | G03F 7/0002 |
| | | | 264/40.5 |
| 2014/0320832 A1* | 10/2014 | Sogard | G01B 13/12 |
| | | | 355/53 |
| 2015/0014892 A1* | 1/2015 | Shinoda | B82Y 10/00 |
| | | | 355/53 |
| 2015/0147424 A1* | 5/2015 | Bibas | B33Y 30/00 |
| | | | 425/150 |
| 2016/0016354 A1* | 1/2016 | Sakamoto | B33Y 30/00 |
| | | | 425/150 |
| 2016/0052179 A1* | 2/2016 | Murayama | G01T 7/00 |
| | | | 250/370.1 |

FOREIGN PATENT DOCUMENTS

| | | |
|---|---|---|
| JP | 2009536591 A | 10/2009 |
| JP | 2009290210 A | 12/2009 |
| JP | 2015144305 A | 8/2015 |
| WO | 2007132320 A2 | 11/2007 |

* cited by examiner

IMPRINT APPARATUS, OPERATION METHOD OF IMPRINT APPARATUS, AND ARTICLE MANUFACTURING METHOD

BACKGROUND OF THE INVENTION

Field of the Invention

The present invention relates to an imprint apparatus, an operation method of the imprint apparatus, and an article manufacturing method.

Description of the Related Art

An imprint apparatus which forms a pattern on a substrate by bringing a mold into contact with an imprint material on the substrate and curing the imprint material has received attention as one type of lithography apparatus (Japanese Patent Laid-Open No. 2009-536591). The mold is pressed against the imprint material on the substrate in a state in which it is deformed into a convex downward, and then reset to flat. With this operation, the pattern (concave portion) of the mold is filled with the imprint material. Then, energy such as light can be applied to the imprint material after the pattern of the mold is filled with the imprint material, curing the imprint material.

If there exist the relative tilts between the substrate and the mold when the mold is brought into contact with the imprint material on the substrate, filling of the pattern of the mold with the imprint material does not proceed uniformly. This may make a time required for filling longer or cause a nonuniform distribution in a RLT (Residual Layer Thickness). The RLT means the thickness of the concave portion of the pattern formed on the substrate by the imprint material. The nonuniform distribution in the RLT may cause a CD error in the pattern formed on the substrate by the imprint material when the substrate is etched by using the pattern.

The relative tilts between the substrate and the mold may be caused by, for example, a substrate chuck tilted when the mold is pressed against the imprint material on the substrate in order to bring the mold into contact with the imprint material.

SUMMARY OF THE INVENTION

The present invention provides a technique advantageous in reducing the relative tilts between a substrate and a mold.

One of aspects of the present invention provides an imprint apparatus which performs an imprint process of forming a pattern on a substrate by bringing a mold into contact with an imprint material on the substrate and curing the imprint material, the apparatus comprising: a substrate stage mechanism including a substrate chuck configured to hold the substrate; a mold driver configured to drive the mold; and a controller configured to control, based on tilt information indicating a tilt of the substrate chuck which is caused by a force received from the mold driver, the mold driver so as to adjust a relative tilt of the mold with respect to the substrate in the imprint process.

Further features of the present invention will become apparent from the following description of exemplary embodiments with reference to the attached drawings.

DESCRIPTION OF THE EMBODIMENTS

An exemplary embodiment of the present invention will be described below with reference to the accompanying drawings.

Figure 1:
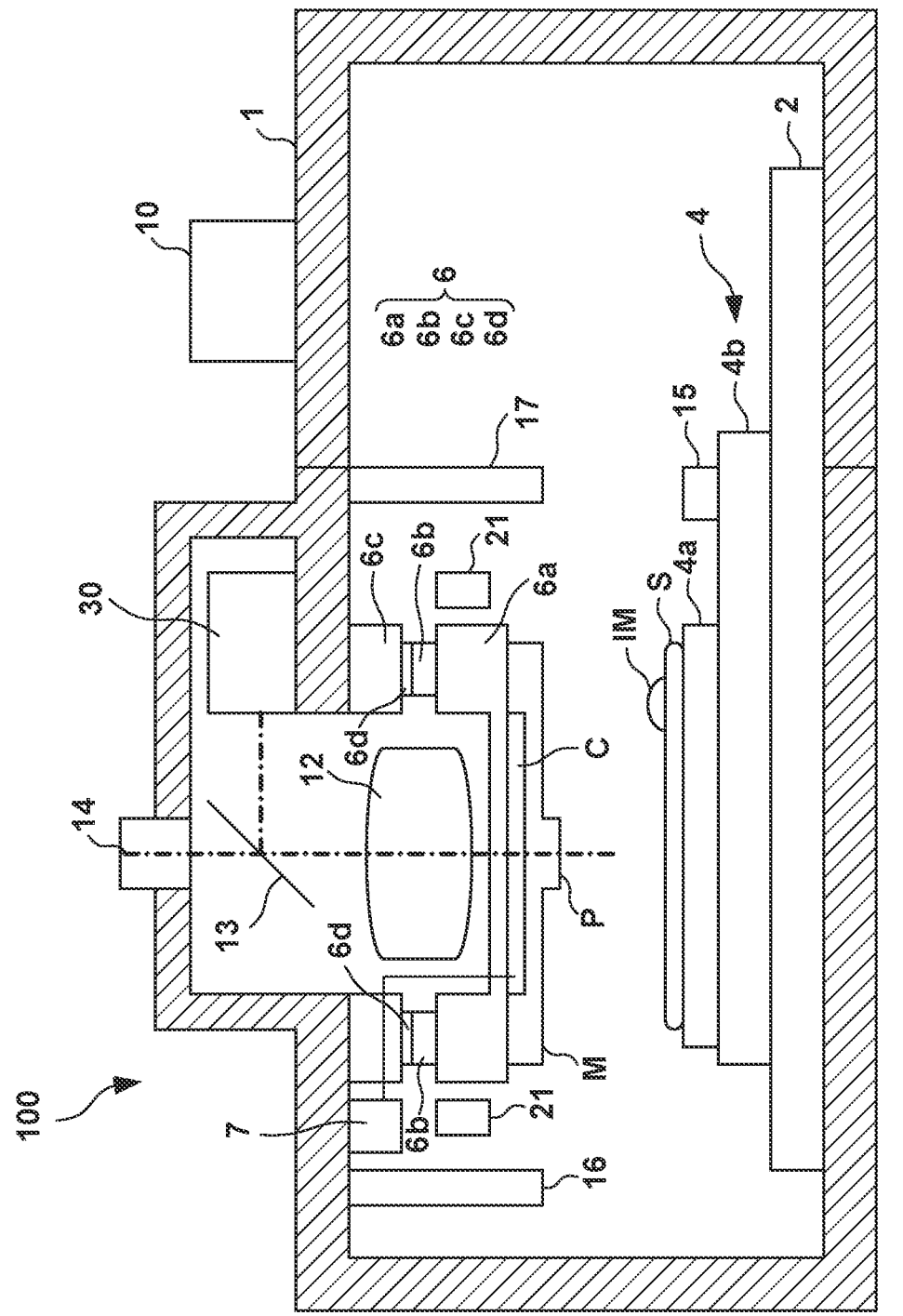
FIG. 1 is a view schematically showing the arrangement of an imprint apparatus according to one embodiment of the present invention.
Figure 2:
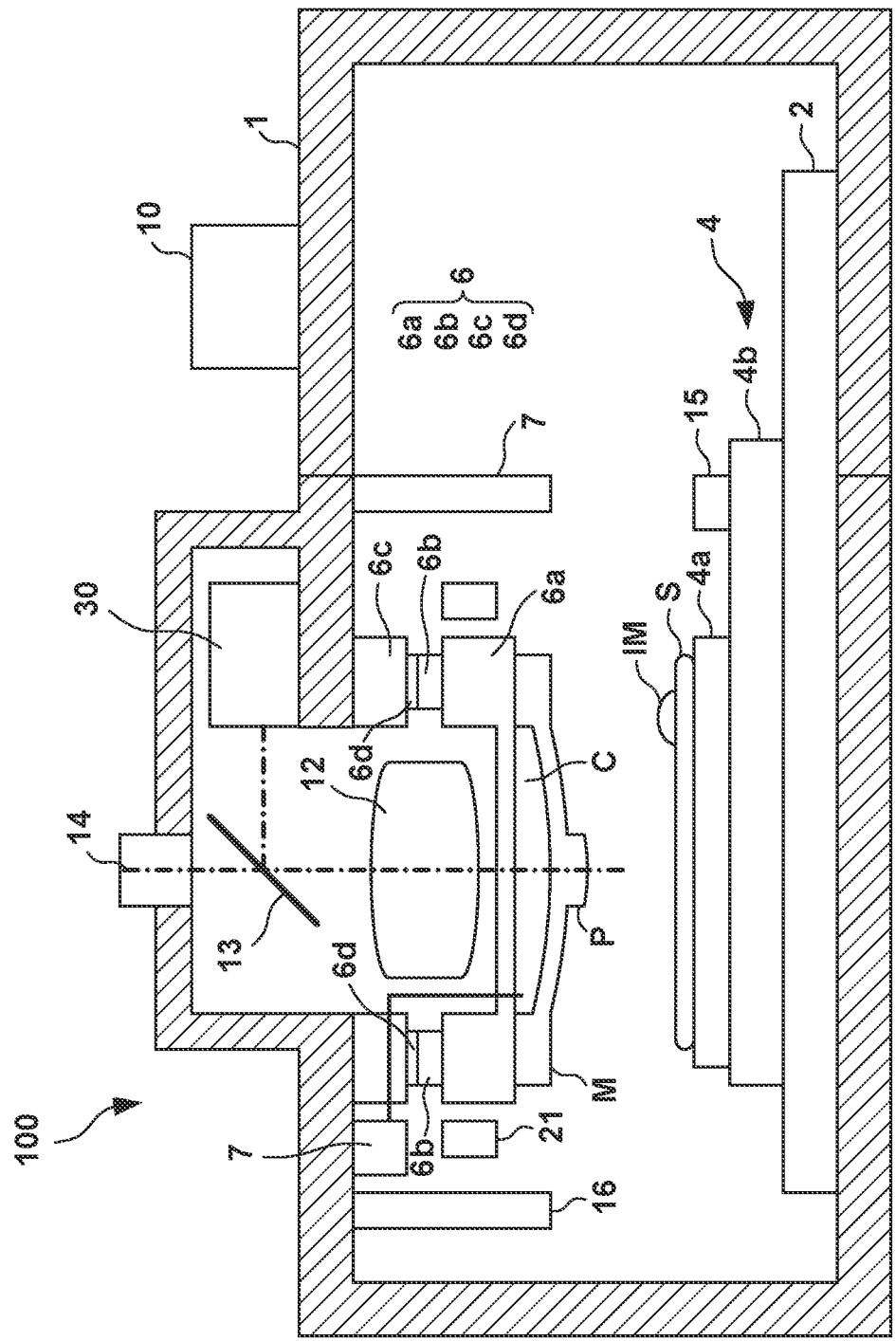
FIG. 2 is a view schematically showing the arrangement of the imprint apparatus according to one embodiment of the present invention.

Each of FIGS. 1 and 2 schematically shows the arrangement of an imprint apparatus 100 according to one embodiment of the present invention. The imprint apparatus 100 forms a pattern in a shot region of a substrate S by bringing a mold M (more particularly, a pattern region P of the mold M) into contact with an imprint material IM arranged in the shot region and curing the imprint material IM. After the imprint material IM is cured, the mold M is separated from the cured imprint material IM. The imprint material IM can be supplied or arranged on the shot region of the substrate S by a supply device 17, but may be supplied onto the substrate S by an apparatus different from the imprint apparatus 100. In this specification, a process of bringing the mold M into contact with the imprint material IM on the substrate S and curing the imprint material IM is referred to as an imprint process. The imprint process may include a process of separating the mold M from the cured imprint material IM.

The imprint material IM is a curable composition which is cured by receiving energy which cures it. The imprint material may mean the cured imprint material or the uncured imprint material. For example, an electromagnetic wave, heat or the like can be used as the curing energy. The electromagnetic wave can be, for example, light (such as infrared light, visible rays, or ultraviolet light) whose wavelength is selected from a range of 10 nm (inclusive) to 1 mm (inclusive).

Curable compositions are compositions typically cured by light irradiation or application of heat. Out of these compositions, a photo-curable composition that is cured by light can contain at least a polymerizable compound and a photopolymerization initiator. The photo-curable composition can additionally contain a non-polymerizable compound or solvent. The non-polymerizable compound can be, for example, at least a material selected from the group consisting of a sensitizer, a hydrogen donor, an internal mold release agent, a surfactant, an antioxidant, a polymer component, and the like.

In this specification and the accompanying drawings, directions are shown in an X-Y-Z coordinate system in which directions parallel to the upper surface of the substrate S form an X-Y plane. Let the X direction, the Y direction, and the Z direction be the directions parallel to the X-axis, the Y-axis, and the Z-axis, respectively, in the X-Y-Z coordinate system. Let θX, θY, and θZ, respectively, be rotation about the X-axis, rotation about the Y-axis, and rotation about the Z-axis. Control or driving regarding the X-axis, the Y-axis, and the Z-axis means control or driving regarding the direction parallel to the X-axis, the direction parallel to the Y-axis, and the direction parallel to the Z-axis, respectively. Further, control or driving regarding the θX-axis, the θY-axis, and the θZ-axis means control or driving regarding rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An orientation is information that can be specified by values of the θX-axis, the θY-axis, and the θZ-axis. A tilt is information that can be specified by values of the θX-axis and the θY-axis.

The imprint apparatus 100 can include, for example, an imprint head 6, a substrate stage mechanism 4, a curing unit 30, the supply device 17, a measurement device 14, a measurement device (first measurement device) 15, a measurement device (second measurement device) 16, a shape controller 7, and a controller 10. A support structure 1 can support the imprint head 6, the curing unit 30, the supply device 17, the measurement devices 14 and 16, and the shape controller 7. The measurement device 15 can be mounted on the movable part (a Y stage (substrate stage) $4b_2$ to be described later) of the substrate stage mechanism 4. The substrate stage mechanism 4 is configured to move the substrate S on a base 2. The controller 10 includes, for example, a CPU and a memory, and controls the imprint process (controls the respective units of the imprint apparatus).

The mold M is generally made of a material such as quartz capable of transmitting ultraviolet light. A pattern for molding the imprint material IM on the substrate S is formed in the partial region P which is a partial region on a surface facing the substrate S. The mold M generally includes a projecting mesa portion serving as the pattern region P. The pattern of the pattern region P is formed by a concave portion. A pattern made of the imprint material IM is formed by curing the imprint material IM in a state in which the concave portion is filled with the imprint material IM.

The curing unit 30 cures the imprint material IM on the shot region by supplying energy which cures the imprint material IM, for example, light such as ultraviolet light to the imprint material IM via the mold M in the imprint process. The curing unit 30 can include, for example, a light source which emits the light which cures the imprint material IM and an optical element for adjusting the light emitted from the light source to light suitable for the imprint process.

The measurement device 14 detects the positional shift between a mark provided in the pattern region P of the mold M and a mark provided in the shot region of the substrate S. Based on a detection result by the measurement device 14, the controller 10 can recognize the relative positional relationship between the shot region of the substrate S and the mold M (more particularly, the pattern region P of the mold M). That is, the controller 10 can use the measurement device 14 to measure the relative positional relationship between the mold M and the shot region of the substrate S. The relative positional relationship includes relative positions and relative rotation angles. An optical system 12 and a bandpass filter 13 can be arranged between the measurement device 14 and the mold M.

The imprint head 6 can include, for example, a mold chuck 6a, a mold driver 6b, a driving base 6c, and a measurement device 21. The mold chuck 6a holds the mold M by a vacuum chuck force, an electrostatic chuck force, or the like. The mold driver 6b includes a plurality of (for example, three) actuators and drives the mold chuck 6a so as to drive the mold chuck 6a with respect to a plurality of axes by the plurality of actuators. For example, the mold driver 6b can be configured to drive the mold chuck 6a with respect to three axes of the Z-axis, the θX-axis, and the θY-axis, but may also be configured to drive the mold chuck 6a with respect to all or some of the other axes (the X-axis, the Y-axis, and the θZ-axis). Each of the mold chuck 6a, the mold driver 6b, and the driving base 6c has an opening region in its center portion (inside), and the energy from the curing unit 30 can pass through the opening region and be supplied to the imprint material IM on the substrate S via the mold M. The measurement device 21 measures a value on the Z-axis (that is, a Z-direction position (height position)), and values (that is, tilts) on the θX-axis and the θY-axis of the mold chuck 6a (mold M). The measurement device 21 can include, for example, a plurality of position measurement units, respectively, corresponding to the plurality of actuators of the mold driver 6b. The imprint head 6 can additionally include a sensor 6d which measures a force obtained when the mold M is pressed against the imprint material IM on the substrate S. The sensor 6d can be provided, for example, for each of the plurality of actuators of the mold driver 6b.

The measurement device 15 can include a distance measurement unit which measures a height position on the lower surface of the mold M. The measurement device 16 can include a distance measurement unit which measures a height position on the upper surface of the substrate S. The shape controller 7 controls the shape of the mold M by controlling the pressure of a cavity C provided on the rear side of the pattern region P of the mold M. It is possible to deform the mold M into a convex shape downward as schematically shown in FIG. 2 by, for example, making the pressure of the cavity C higher than an atmospheric pressure. It is possible to reset the shape of the mold M to a natural state (typically, a state in which the rear side of the pattern region P becomes flat) as schematically shown in FIG. 1 by making the pressure of the cavity C equal to the atmospheric pressure.

The substrate stage mechanism 4 can include, for example, a substrate chuck 4a which holds the substrate S by the vacuum chuck force, the electrostatic chuck force, or the like, and a substrate driver 4b which mechanically holds and drives the substrate chuck 4a with respect to the plurality of axes on the base 2. For example, the substrate driver 4b can be configured to drive the substrate chuck 4a with respect to the three axes of the X-axis, the Y-axis, and the θZ-axis, but may also be configured to drive the substrate chuck 4a with respect to all or some of the other axes (the Z-axis, the θX-axis, and the θY-axis).

In one example, the substrate driver 4b can perform control of the relative positional relationship between the mold M and the substrate S (more particularly, the shot region of the substrate S) with respect to the X-axis, the Y-axis, and the θZ-axis. However, the mold driver 6b or both the substrate driver 4b and the mold driver 6b may perform the control. In one example, the imprint head 6 performs control (control with respect to the Z-axis) of the distance between the substrate S and the mold M. However, the mold driver 6b or both the substrate driver 4b and the mold driver 6b may perform the control.

Figure 3A:
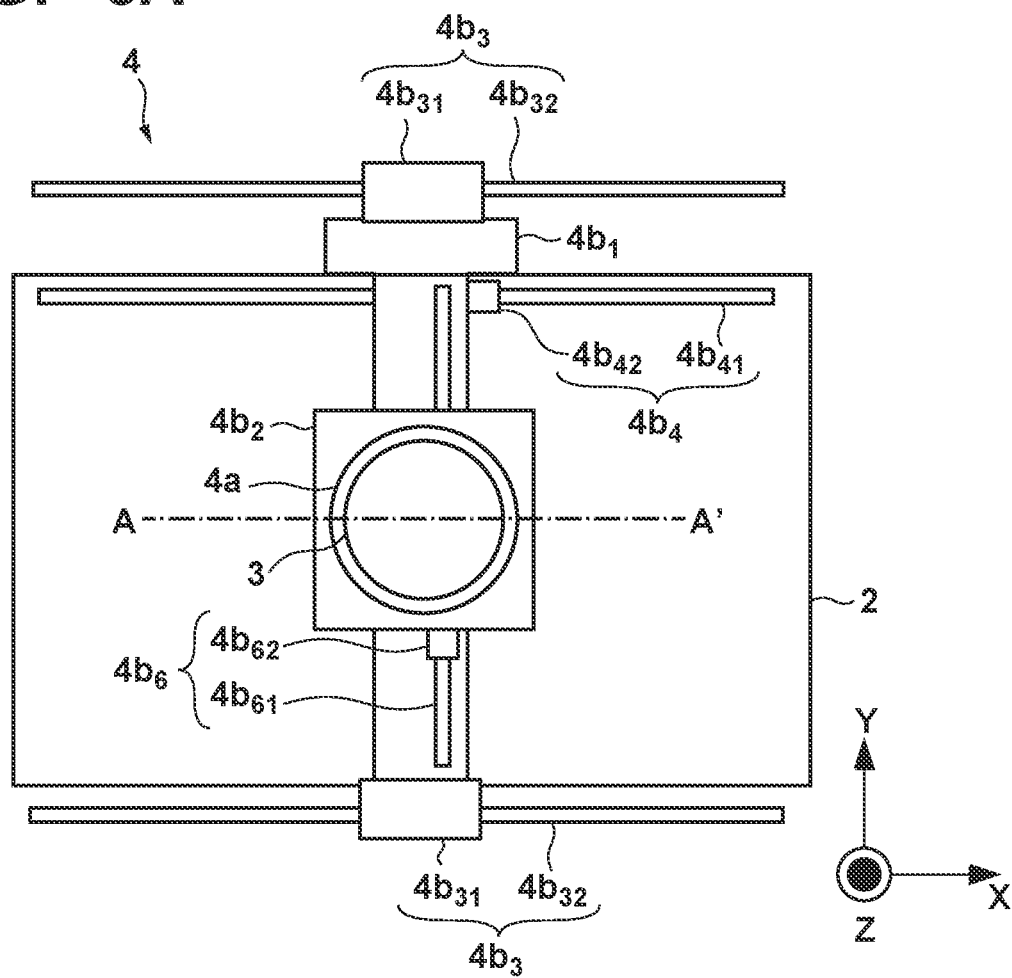
FIGS. 3A and 3B are views showing an example of the arrangement of a substrate stage.
Figure 3B:
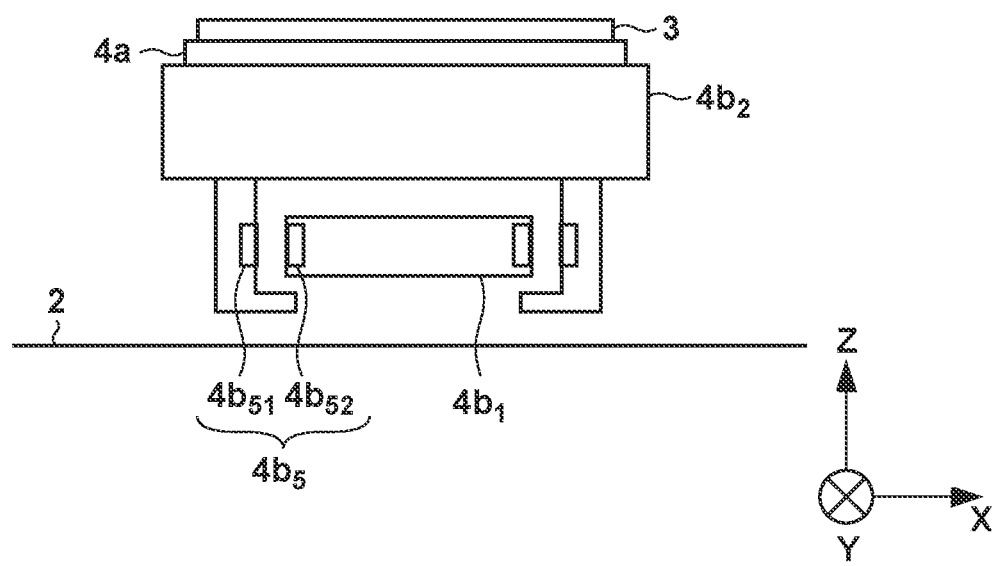

FIGS. 3A and 3B show an example of the arrangement of the substrate stage mechanism 4. FIG. 3A is a view showing the substrate stage mechanism 4 in the Z direction. FIG. 3B is a sectional view taken along a line A-A' of FIG. 3A. The substrate stage mechanism 4 includes the substrate chuck 4$a$ and the substrate driver 4$b$. The substrate driver 4$b$ can include, for example, an X stage 4$b_1$ and the Y stage (substrate stage) 4$b_2$. The X stage 4$b_1$ is configured to move, by a static pressure guide (air bearing) (not shown), on the base 2 in the X direction. The Y stage 4$b_2$ is configured to support the substrate chuck 4$a$ and move, by the static pressure guide (air bearing) (not shown), on the X stage 4$b_1$ in the Y direction. The substrate driver 4$b$ thus configured can move the Y stage 4$b_2$ and the substrate chuck 4$a$ (substrate S) in the X direction by driving the X stage 4$b_1$ in the X direction. The substrate driver 4$b$ can also move the substrate chuck 4$a$ (substrate S) in the Y direction by driving the Y stage 4$b_2$ in the Y direction. That is, the substrate driver 4$b$ can move the substrate S in the X direction and the Y direction by driving the X stage 4$b_1$ in the X direction and driving the Y stage 4$b_2$ in the Y direction.

A first driver 4$b_3$ drives the X stage 4$b_1$ on the base 2 in the X direction. The first driver 4$b_3$ can include, for example, a linear motor that includes a mover 4$b_{31}$ which includes a permanent magnet and a stator 4$b_{32}$ which includes a plurality of coils arrayed in the X direction. Then, the first driver 4$b_3$ can drive the X stage 4$b_1$ in the X direction by controlling a current supplied to the plurality of coils in the stator 4$b_{32}$ to move the mover 4$b_{31}$ along the stator 4$b_{32}$. For example, a first detector 4$b_4$ constituted by an encoder, an interferometer, or the like can detect the position of the X stage 4$b_1$ in the X direction. In the example shown in FIGS. 3A and 3B, an encoder that includes a scale 4$b_{41}$ and a head 4$b_{42}$ which detects the position of the X stage 4$b_1$ in the X direction by reflected light from the scale 4$b_{41}$ is provided as the first detector 4$b_4$.

A second driver 4$b_5$ drives the Y stage 4$b_2$ on the X stage 4$b_1$ in the Y direction. As shown in FIG. 3B, the second driver 4$b_5$ can include, for example, a linear motor that includes a mover 4$b_{51}$ which includes a permanent magnet and a stator 4$b_{52}$ which includes a plurality of coils arrayed in the Y direction. Then, the second driver 4$b_5$ can drive the Y stage 4$b_2$ in the Y direction by controlling a current supplied to the plurality of coils in the stator 4$b_{52}$ to move the mover 4$b_{51}$ along the stator 4$b_{52}$. For example, a second detector 4$b_6$ constituted by an encoder, an interferometer, or the like can detect the position of the Y stage 4$b_2$ in the Y direction. In the example shown in FIGS. 3A and 3B, an encoder that includes a scale 4$b_{61}$ and a head 4$b_{62}$ which detects the position of the Y stage 4$b_2$ in the Y direction by reflected light from the scale 4$b_{61}$ is provided as the second detector 4$b_6$.

A radial guide (not shown) is provided between the Y stage 4$b_2$ and the substrate chuck 4$a$. The substrate chuck 4$a$ is supported with high rigidity in the X-axis and Y-axis directions, and is configured to move freely only in the θZ direction of the rotation about the Z-axis. A voice coil motor and an encoder (not shown) are provided between the Y stage 4$b_2$ and the substrate chuck 4$a$. The encoder measures the θZ displacement of the substrate chuck 4$a$. Positioning control of the substrate chuck in the θZ direction is performed with a control force by the voice coil motor.

In an arrangement in which the substrate S or the substrate chuck 4$a$ (Y stage 4$b_2$) is supported via the static pressure guide (air bearing) as described above, the substrate S or the substrate chuck 4$a$ may tilt when a force is applied to the substrate S in the imprint process. Particularly, when the orientation of the substrate S (substrate chuck 4$a$) does not undergo servo control (feedback control) in the imprint process, the orientation of the substrate S is never corrected.

Figure 4:
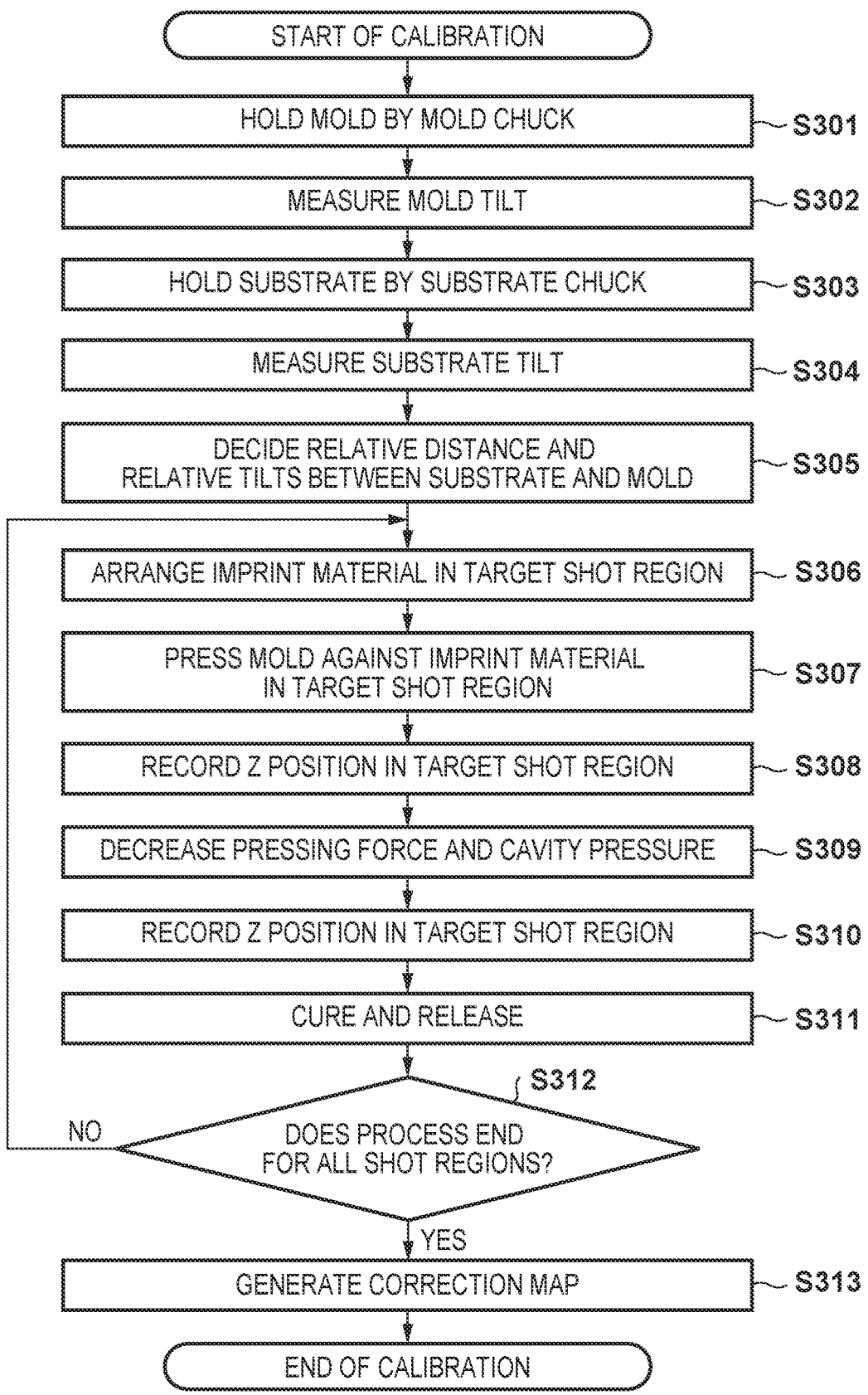
FIG. 4 is a flowchart showing the sequence of calibration processing as an operation method of the imprint apparatus according to one embodiment of the present invention.

The operation method of the imprint apparatus 100 will be described below with reference to FIGS. 4 to 9. The controller 10 can perform calibration processing, for example, in accordance with a command from a user or a host control apparatus, or before the process of the substrate or a lot (the unit of a process for a plurality of substrates). FIG. 4 shows the sequence of the calibration processing. The controller 10 controls the calibration processing. In step S301, the controller 10 controls a transfer mechanism (not shown) to transfer the mold M to the mold chuck 6$a$ and hold the mold M by the mold chuck 6$a$. In step S302, the controller 10 uses the measurement device 15 to measure values of the Z-axis (Z-direction positions), that is, height positions at a plurality of measurement target points in the pattern region P (mesa portion) of the mold M. At this time, the measurement device 15 is moved by moving the Y stage 4$b_2$ to the substrate stage mechanism 4 in accordance with the measurement target points in the pattern region P of the mold M. Based on this measurement result, information is obtained which indicates the values of the θX-axis and the θY-axis (that is, the tilts with respect to the θX-axis and the θY-axis) in addition to the height position at a representative point in the pattern region P. That is, in step S302, the height position and the tilt at the representative point in the mold M (more particularly, the pattern region P) are measured. The height position and the tilt at the representative point are calculated regarding the pattern region P of the mold M as a plane.

In step S303, the controller 10 controls a transfer mechanism (not shown) to transfer the substrate S to the substrate chuck 4$a$ and hold the substrate S by the substrate chuck 4$a$. In step S304, the controller 10 uses the measurement device 16 to measure values of the Z-axis (Z-direction positions), that is, height positions at a plurality of measurement target points (for example, representative points in all or some of the shot regions) on the substrate S. At this time, the measurement target points are moved into a measurement region of the measurement device 16 by moving the Y stage 4$b_2$ to the substrate stage mechanism 4 in accordance with the measurement target points on the substrate S. Based on this measurement result, information is obtained which indicates the tilts with respect to the θX-axis and the θY-axis in addition to the height position at the representative point on the substrate S. That is, in step S304, the height position and the tilt at the representative point on the substrate S are measured. The height position and the tilt at the representative point are calculated regarding the upper surface of the substrate S as a plane.

In step S305, the controller 10 calculates the relative distance (to be referred to as the relative distance hereinafter) and the relative tilts (to be referred to as the relative tilts hereinafter) between the substrate S and the mold M based on the measurement results in steps S302 and S304. The relative tilts obtained in step S305 are the relative tilts between the substrate S and the mold M in a state in which the substrate S and the mold M are not in contact with each other via the imprint material IM. Such relative tilts may be caused by the support surface of the substrate chuck 4$a$, the support surface of the mold chuck 6$a$, a control error in the substrate stage mechanism 4, a control error in the imprint head 6, the processing accuracy of the substrate S, the processing accuracy of the mold M, and the like.

Based on the relative distance and the relative tilts obtained in step S305, the mold chuck 6$a$ can be driven so as to cancel a difference in relative distance from a target relative distance and differences in relative tilts from target relative tilts. Alternatively, the relative distance and the relative tilts obtained here may be utilized as correction information in driving the mold chuck 6a later.

In step S306, the controller 10 controls the supply device 17 and the substrate stage mechanism 4 to supply the imprint material onto a shot region as an imprinting target (to be referred to as a target shot region hereinafter) on the substrate S. In step S307, the shape controller 7 is controlled to deform the mold M into a convex downward by increasing the pressure of the cavity C on the mold M, and the imprint head 6 is controlled to press the pattern region P against the imprint material IM on the target shot region. In step S308, the controller 10 obtains a Z-direction position (height position) in the target shot region of the substrate S in step S307 based on the output log of the measurement device 21 and records the height position.

In step S309, the controller 10 controls the shape controller 7 to reset the mold M in the natural state and make the pattern region P of the mold M flat by decreasing the pressure of the cavity C. Consequently, the entire pattern region P contacts the imprint material on the target shot region, and the pattern (concave portion) of the pattern region P is filled with the imprint material IM. In step S310, the controller 10 obtains a Z-direction position (height position) in the target shot region of the substrate S in step S309 based on the output log of the measurement device 21 and records this.

In step S311, the controller 10 controls the curing unit 30 to supply energy to the imprint material IM on the target shot region to cure the imprint material IM, and then controls the imprint head 6 to separate the mold M from the cured imprint material IM. In step S312, the controller 10 determines whether a process for all the shot regions in which steps S305 to S311 should be executed is completed. The process returns to step S306 if the unprocessed shot region remains; otherwise, the process advances to step S313. In step S313, the controller 10 generates a correction map (tilt information) based on information recorded in steps S308 and S310. Detailed correction map generation will be described later.

Figure 5:
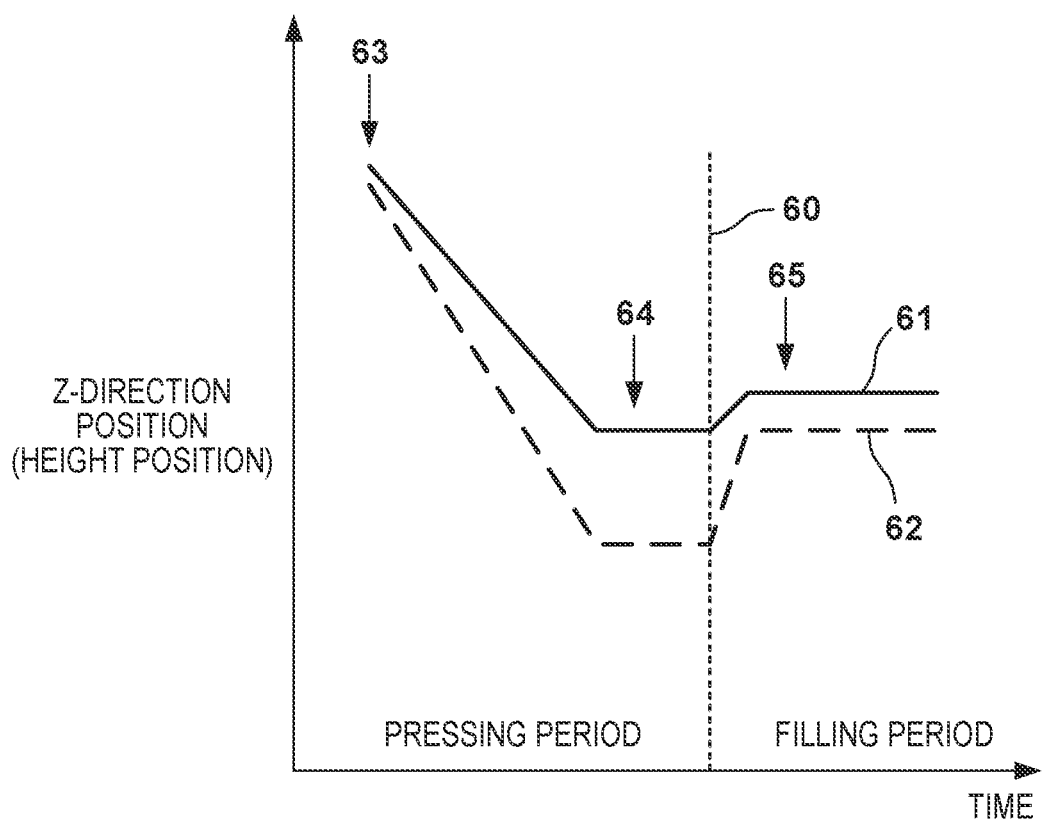
FIG. 5 is a graph schematically showing a change in the Z-direction position (height position) of a shot region as an imprinting target in an imprint process.

FIG. 5 schematically shows a change in the Z-direction position (height position) in the shot region as the imprinting target on the substrate S in the imprint process. The Z position of the mold chuck 6a in the imprint process can be evaluated in states 63, 64, and 65. In the state 63, the pattern region P of the mold M deformed into the convex downward starts to contact the imprint material IM in the shot region. The Z-direction position (height position) in the shot region in the state 63 can be obtained from the Z-direction positions at the plurality of measurement target points on the substrate S obtained in step S304. Alternatively, the state 63 is detected based on the output of the sensor 6d, and the Z position in the target shot region of the substrate can be obtained based on the output of the measurement device 21 in this detection.

In the state 64, a force of pressing the mold M against the imprint material IM on the shot region is gradually made stronger, and the mold chuck 6a reaches the lowest point. In the state 65, the pressure of the cavity C on the mold M is decreased, and a pressing force is weakened after the state 64, and the force of pressing the mold M against the imprint material IM on the shot region is almost zero. The Z-direction position in the shot region is raised as the force of pressing the mold M against the imprint material IM on the shot region is weakened.

A curve 61 indicates the Z-direction position of a shot region in the center portion of the substrate S when the shot region is imprinted. A curve 62 indicates the Z-direction position of a shot region in the peripheral portion of the substrate S when the shot region is imprinted. A pressing period during which the mold M is pressed against the imprint material is on the left side of a dotted line 60. A filling period during which pressing of the mold M against the imprint material is canceled, and filling of the pattern (concave portion) of the pattern region P of the mold M with the imprint material IM is awaited is on the right side of the dotted line 60.

The above result indicates that the Z-direction position in the shot region to which the force is applied via the mold M out of the plurality of shot regions of the substrate S can change depending on the shot region of the substrate S. This suggests that the tilt of the substrate chuck 4a can change depending on which region of the substrate S the force is applied to. Therefore, the orientation of the substrate chuck 4a in the imprint process will be considered.

Figure 6:
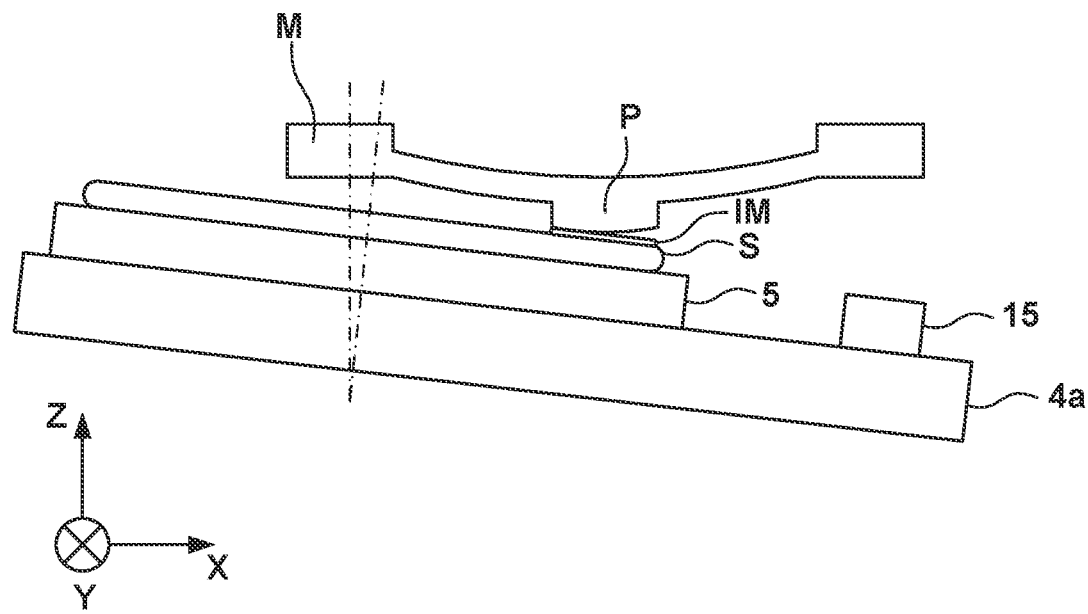
FIG. 6 is a view schematically showing the orientation of a substrate chuck in a pressing period.

FIG. 6 schematically shows the orientation of the substrate chuck 4a in the pressing period, and more particularly, a period during which the pattern region P of the mold M is pressed against the imprint material IM in the shot region in the peripheral portion of the substrate S. A moment acts by pressing the peripheral portion (right side) of the substrate S with the mold M (imprint head 6) via the imprint material IM, and the right side of the substrate chuck 4a tilts downward. As described above, in an arrangement in which the static pressure guide (air bearing) supports the Y stage (substrate stage) $4b_1$ which supports the substrate chuck 4a, the substrate chuck 4a may tilt by pressing the mold M against the imprint material IM on the substrate S as described above.

Figure 7:
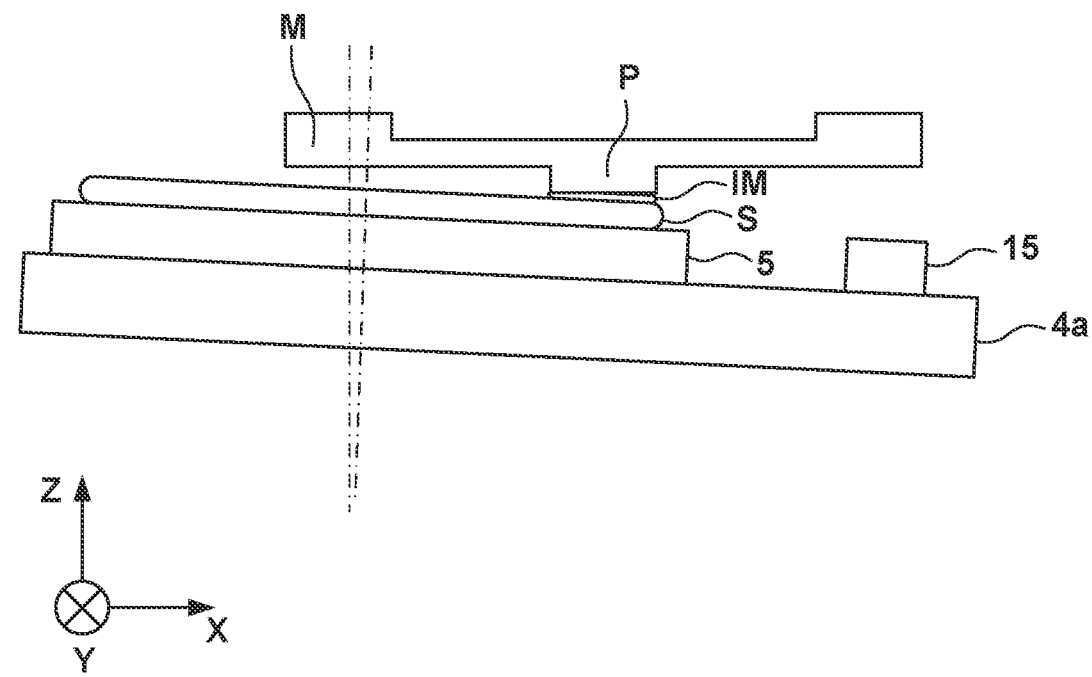
FIG. 7 is a view schematically showing the orientation of the substrate chuck in a filling period.

FIG. 7 schematically shows the orientation of the substrate chuck 4a in the filling period after the pressing period. A force that the substrate chuck 4a receives from the mold M (imprint head 6) becomes almost zero in the filling period, and thus considering simply, it seems that the orientation of the substrate chuck 4a is reset to horizontal. When the orientation of the substrate chuck 4a changes, however, an Abbe error resulting from an orientation change causes a displacement in the X and Y directions. If the position of the substrate stage mechanism 4 in the X and Y directions undergoes servo control (feedback control), the substrate stage mechanism 4 generates a force in a direction that cancels this displacement. This force generates a shearing force between the substrate S and the mold M via the imprint material IM. After the force of pressing the mold M (imprint head 6) against the substrate chuck 4a becomes almost zero, the shearing force between the substrate S and the mold M remains because of the viscosity of the imprint material IM. Accordingly, the orientation of the substrate chuck 4a is not reset to horizontal also in the filling period. This is confirmed through a simulation.

A description will be made referring back to FIG. 5. In the state 63, the orientation of the substrate chuck 4a is horizontal. It is therefore considered that the difference in Z-direction position between the shot region 61 and the shot region 62 is caused by the surface shape of the substrate S. In the state 64, the Z-direction positions in the shot regions 61 and 62 of the substrate S are moved down upon pressing the substrate S downward by pressing the mold M against the imprint material. The difference in Z-direction position between the imprint process for the shot region 61 in the peripheral portion and the imprint process for the shot region 62 in the center portion indicates that the tilt of the substrate chuck 4a changes depending on the position of the shot region as the imprinting target. In the state 65, the pressing force becomes almost zero, but the influence of the aforementioned remaining shearing force becomes evident.

Figure 8:
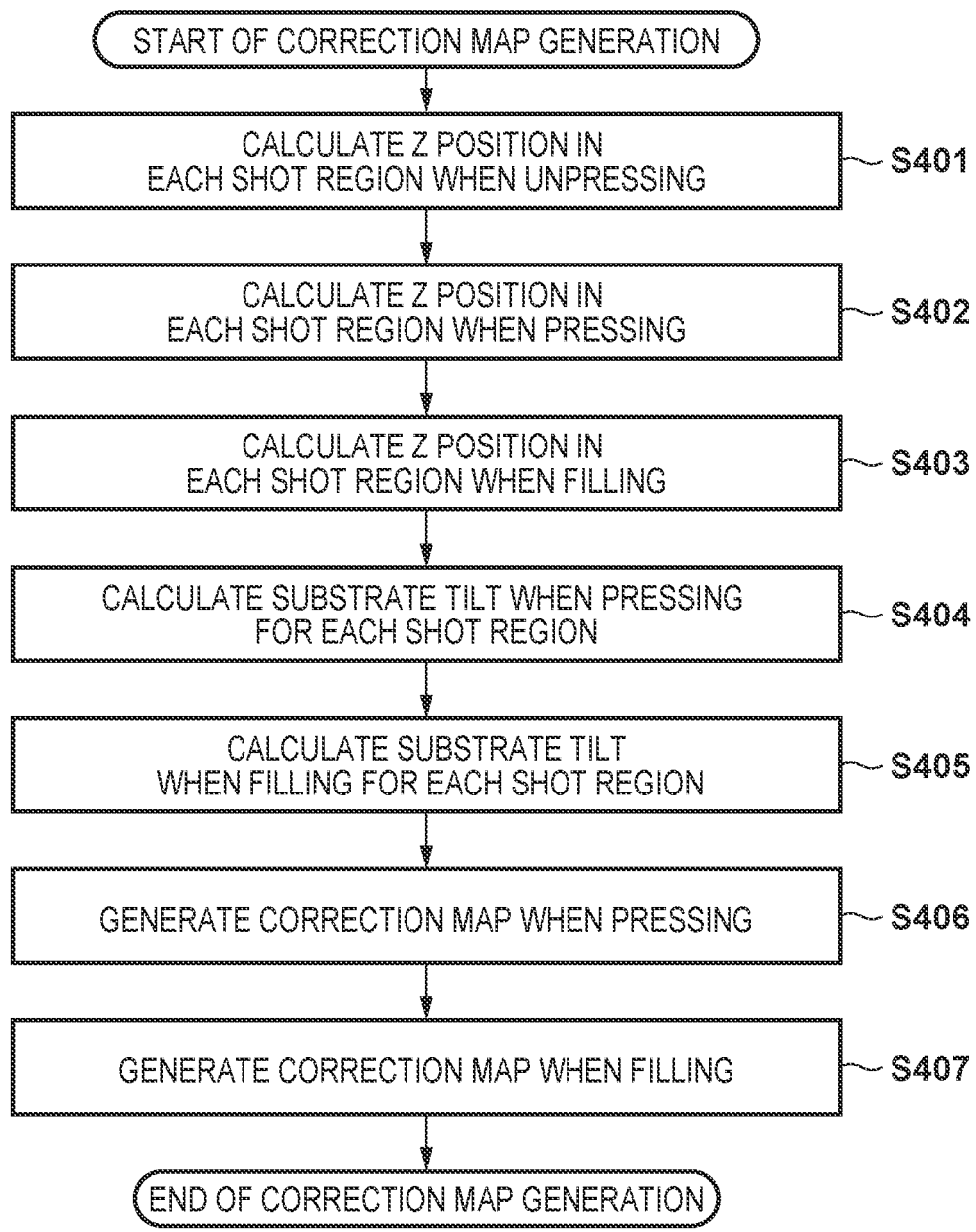
FIG. 8 is a flowchart showing detailed correction map generation in step S313 of FIG. 4.

FIG. 8 shows detailed correction map generation in step S313 of FIG. 4. In step S401, the controller 10 calculates or obtains a Z-direction position Z63(i) in each shot region (xi, yi) of the substrate S in the state 63 (when unpressing). Giving a concrete example, the controller 10 calculates or obtains the Z-direction position Z63(i) in each shot region (xi, yi) of the substrate S based on the Z-direction positions at the plurality of measurement target points on the substrate S obtained in step S304.

In step S402, the controller 10 calculates or obtains a Z-direction position Z64(i) in each shot region (xi, yi) of the substrate S in the state 64 (when pressing). Giving a concrete example, the controller 10 calculates or obtains the Z-direction position Z64(i) in each shot region (xi, yi) of the substrate S based on the log (the output of the measurement device 21) recorded in step S307.

In step S403, the controller 10 calculates or obtains a Z-direction position Z65(i) in each shot region (xi, yi) of the substrate S in the state 65 (when filling). Giving a concrete example, the controller 10 calculates or obtains the Z-direction position Z65(i) in each shot region (xi, yi) of the substrate S based on the log (the output of the measurement device 21) recorded in step S309.

In step S404, with reference to a value Z63(0)-Z64(0) of a shot region (x0, y0) in the center portion of the substrate S, the controller 10 calculates tilts ETx1(i) and ETy1(i) of the substrate S (substrate chuck 4a) in the state 64 (when pressing) in accordance with:

$$ETx1(i)=\{(Z63(i)-Z64(i))-(Z63(0)-Z64(0))\}/(xi-x0)$$

$$ETy1(i)=\{(Z63(i)-Z64(i))-(Z63(0)-Z64(0))\}/(yi-y0)$$

where ETx1(i) is the tilt of the substrate S on the θY-axis when pressing in the imprint process for the shot region (xi, yi), ETy1(i) is the tilt of the substrate S on the θX-axis when pressing in the imprint process for the shot region (xi, yi), and a calculation can be made with the assumption that (x0, y0)=(0, 0).

In step S405, with reference to a value Z63(0)-Z65(0) of the shot region (x0, y0) in the center portion of the substrate S, the controller 10 calculates tilts ETx2(i) and ETy2(i) of the substrate S (substrate chuck 4a) in the state 65 (when filling) in accordance with:

$$ETx2(i)=\{(Z63(i)-Z65(i))-(Z63(0)-Z65(0))\}/(xi-x0)$$

$$ETy2(i)=\{(Z63(i)-Z65(i))-(Z63(0)-Z65(0))\}/(yi-y0)$$

where ETx2(i) is the tilt of the substrate S on the θY-axis when filling in the imprint process for the shot region (xi, yi), ETy2(i) is the tilt of the substrate S on the θX-axis when filling in the imprint process for the shot region (xi, yi), and a calculation can be made with the assumption that (x0, y0)=(0, 0).

In step S406, based on a calculation result in step S404, the controller 10 generates a correction map containing tilt information for each shot region of the substrate S when pressing. In step S407, based on a calculation result in step S405, the controller 10 generates a correction map containing tilt information for each shot region of the substrate S when filling.

In place of the above-described mode, the controller 10 may calculate, with reference to the Z-direction position when filling, the tilts ETx1(i) and ETy1(i) of the substrate S (substrate chuck 4a) in the state 64 (when pressing) in accordance with:

$$ETx1(i)=\{(Z64(i)-Z65(i))-(Z64(0)-Z65(0))\}/(xi-x0)$$

$$ETy1(i)=\{(Z64(i)-Z65(i))-(Z64(0)-Z65(0))\}/(yi-y0)$$

where a calculation can be made with the assumption that (x0, y0)=(0, 0).

In step S304 described above, the controller 10 may also obtain the Z position Z63(i) of the target shot region of the substrate S in the state 63 based on the log (the output of the measurement device 21) recorded in step S307.

Figure 9:
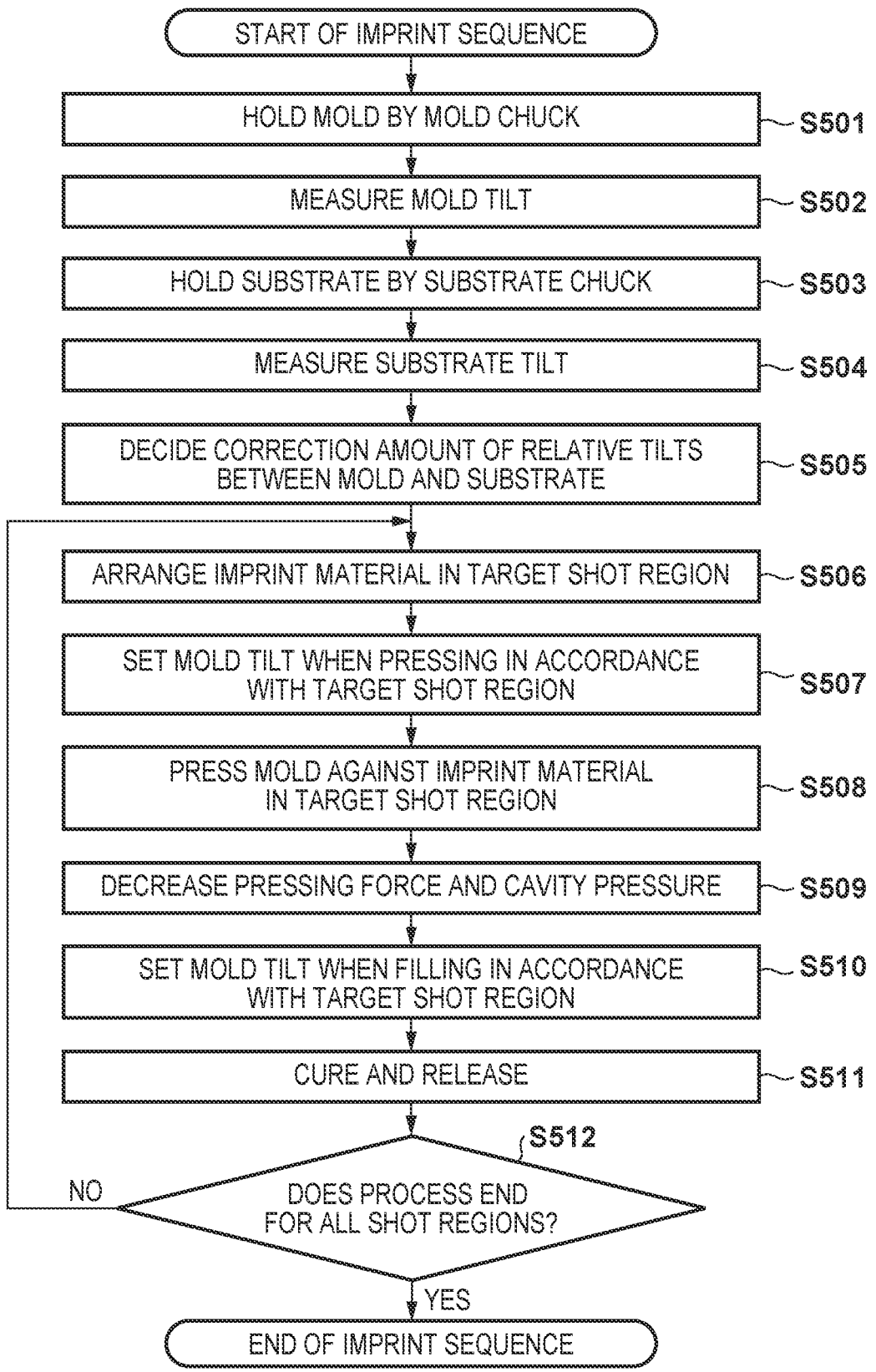
FIG. 9 is a flowchart showing an imprint sequence as the operation method of the imprint apparatus according to one embodiment of the present invention.

FIG. 9 shows the sequence of an imprint sequence. The controller 10 controls the imprint sequence. In step S501, the controller 10 controls the transfer mechanism (not shown) to transfer the mold M to the mold chuck 6a and hold the mold M by the mold chuck 6a. In step S502, the controller 10 uses the measurement device 15 to measure the Z-direction positions (height positions) at the plurality of measurement target points in the pattern region P (mesa portion) of the mold M. At this time, the measurement device 15 is moved by moving the Y stage $4b_2$ to the substrate stage mechanism 4 in accordance with the measurement target points in the pattern region P of the mold M. Based on this measurement result, the information is obtained which indicates the tilts with respect to the θX-axis and the θY-axis in addition to the height position at the representative point in the pattern region P. That is, in step S502, the height position and the tilt at the representative point in the mold M (more particularly, the pattern region P) are measured. The height position and the tilt at the representative point are calculated regarding the pattern region P of the mold M as the plane.

In step S503, the controller 10 controls the transfer mechanism (not shown) to transfer the substrate S to the substrate chuck 4a and hold the substrate S by the substrate chuck 4a. In step S504, the controller 10 uses the measurement device 16 to measure the Z-direction positions (height positions) at the plurality of measurement target points (for example, the representative points in all or some of the shot regions) on the substrate S. At this time, the measurement target points are moved into the measurement region of the measurement device 16 by moving the Y stage $4b_2$ to the substrate stage mechanism 4 in accordance with the measurement target points on the substrate S. Based on this measurement result, the information is obtained which indicates the tilts with respect to the θX-axis and the θY-axis in addition to the height position at the representative point on the substrate S. That is, in step S504, the height position and the tilt at the representative point on the substrate S are measured. The height position and the tilt at the representative point are calculated regarding the upper surface of the substrate S as the plane.

In step S505, the controller 10 calculates the relative distance and the relative tilts between the substrate S and the mold M based on the measurement results in steps S502 and S504. Based on the relative distance and the relative tilts obtained here, the mold chuck 6a can be driven so as to cancel the difference in relative distance from the target relative distance and the differences in relative tilts from the target relative tilts. Alternatively, the relative distance and the relative tilts obtained here may be utilized as the correction information in driving the mold chuck 6a later.

In step S506, the controller 10 controls the supply device 17 and the substrate stage mechanism 4 to supply the imprint material to the shot region as the imprinting target (target shot region) on the substrate S. In step S507, based on the correction map when pressing obtained by the aforementioned calibration processing, the controller 10 sets the tilt of the mold M in accordance with the target shot region. In step S508, the shape controller 7 is controlled to deform the mold M into the convex downward by increasing the pressure of the cavity C on the mold M, and the imprint head 6 is controlled to press the pattern region P against the imprint material IM on the target shot region. At this time, the mold M is pressed against the imprint material IM on the target shot region in a state in which the imprint head 6 controls the mold M to be the tilt set in step S507.

In step S509, the controller 10 controls the shape controller 7 to reset the mold M in the natural state and make the pattern region P of the mold M flat by decreasing the pressure of the cavity C. Consequently, the entire pattern region P contacts the imprint material on the target shot region, and the pattern (concave portion) of the pattern region P is filled with the imprint material IM. In step S510, based on the correction map when filling obtained by the aforementioned calibration processing, the controller 10 sets the tilt of the mold M in accordance with the target shot region. Consequently, the imprint head 6 controls the mold M to be the tilt set in accordance with the correction map when filling. It is therefore possible to reduce the relative tilts between the substrate and the mold resulting from the tilt of the substrate chuck by pressing the mold against the imprint material IM on the substrate S.

In step S511, the controller 10 controls the curing unit 30 to supply the energy to the imprint material IM on the target shot region to cure the imprint material IM, and then controls the imprint head 6 to separate the mold M from the cured imprint material IM. In step S512, the controller 10 determines whether a process for all the shot regions in which steps S506 to S511 should be executed is completed. The process returns to step S506 if the unprocessed shot region remains; otherwise, a series of processes for the substrate S ends.

An article manufacturing method will be described below. The article manufacturing method of manufacturing a device (a semiconductor integrated circuit device, a liquid crystal display device, or the like) as an article will be described here as one example. The article manufacturing method includes a step of forming a pattern on a substrate (a wafer, a glass plate, or a film-like substrate) by using the above-described imprint apparatus. The manufacturing method can further include a step of processing (for example, etching) the substrate on which the pattern has been formed. Note that when another article such as a patterned media (storage medium) or an optical element is manufactured, the manufacturing method can include, instead of etching, another process of processing the substrate on which the pattern has been formed. The article manufacturing method according to this embodiment is superior to a conventional method in at least one of the performance, quality, productivity, and production cost of the article.

A pattern of a cured product formed by using the imprint apparatus is used permanently for at least some of various articles or used temporarily when the various articles are manufactured. The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes, for example, an imprinting mold.

The pattern of the cured product is used without any change as a constituent member of at least some of the above-described articles or used temporarily as a resist mask. The resist mask is removed after etching, ion implantation, or the like is performed in a processing step of the substrate.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-057557, filed Mar. 22, 2016, which is hereby incorporated by reference herein in its entirety.

What is claimed is:

1. An imprint apparatus which performs an imprint process of forming a pattern on a substrate for manufacturing by curing an imprint material after pressing a mold having a pattern structure against the imprint material on the substrate for manufacturing, the apparatus comprising:
   a substrate stage mechanism including a substrate chuck configured to hold the substrate for manufacturing or a substrate for calibration;
   a mold driver configured to drive the mold, the driving of the mold by the mold driver including pressing the mold against the imprint material on the substrate for manufacturing or the substrate for calibration, wherein the mold driver includes a plurality of actuators for tilting the mold;
   a measurement device that measures a height position of the substrate for calibration while the mold driven by the mold driver is pressed against the imprint material on the substrate for calibration held by the substrate chuck; and a controller configured to control the mold driver so that the mold is pressed against the imprint material on the substrate for calibration held by the substrate chuck, and then
to control the measurement device to obtain the height positions of the substrate for calibration held by the substrate chuck, for each of a plurality of regions of the substrate for calibration, and
to generate tilt information indicating a tilt of the substrate chuck which is generated by a force received from the mold driven by the mold driver, based on the height positions of the plurality of regions of the substrate for calibration obtained by the measurement device,
wherein the controller is further configured to control the plurality of actuators of the mold driver based on the tilt information so that a relative tilt of the mold driven by the mold driver with respect to the substrate for manufacturing becomes a tilt corresponding to a region selected from a plurality of regions of the substrate for manufacturing held by the substrate chuck, thereby reducing relative tilt between the substrate and the mold during the imprint process and
to control the mold driver so as to press the mold tilted by the plurality of actuators against the imprint material on the selected region of the substrate for manufacturing.

2. The apparatus according to claim 1, wherein the controller generates the tilt information based on the height position of each of the plurality of regions of the substrate for calibration held by the substrate chuck.

3. The apparatus according to claim 1, wherein the tilt information contains a plurality of pieces of information, respectively, corresponding to a plurality of positions of the mold chuck during a period in which the mold driven by the mold driver and the imprint material on the substrate for calibration held by the substrate chuck are in contact with each other.

4. The apparatus according to claim 3, wherein the plurality of positions includes (i) a position in which the mold is pressed against the imprint material on the substrate and (ii) a position obtained after pressing of the mold against the imprint material is canceled.

5. The apparatus according to claim 1, wherein the measurement device comprises a first measurement device configured to measure a tilt of the mold and a second measurement device configured to measure a tilt of the substrate,
wherein based on a measurement result by the first measurement device and a measurement result by the second measurement device, the controller generates tilt correction information for correcting a tilt of the mold relative to the substrate for manufacturing in a state in which the substrate for manufacturing and the mold are not in contact with each other via the imprint material, and
adjusts the tilt of the mold in the imprint process based on the tilt information and the tilt correction information.

6. The apparatus according to claim 1, wherein the height positions of the substrate for calibration when the mold is in contact with the imprint material depend on the plurality of regions of the substrate for calibration.

7. The apparatus according to claim 1, wherein the substrate stage is supported by an air bearing.

8. The apparatus according to claim 1, wherein the height position of the substrate for manufacturing held by the substrate chuck changes when the mold driven by the mold driver is pressed against the imprint material of the substrate for manufacturing.

9. The apparatus according to claim 1, wherein the mold has a pattern region pressed against the imprint material and a cavity arranged opposite to the pattern region, and
the mold is deformed into a convex shape towards the substrate for manufacturing when a pressure is applied to the cavity.

10. The apparatus according to claim 9,
the controller is configured to control pressing the mold against the imprint material on the substrate for manufacturing, in a state that the mold is deformed into the convex shape towards the substrate for manufacturing by the pressure being applied to the cavity.

* * * * *